US007027548B1

(12) United States Patent
Palusa et al.

(10) Patent No.: US 7,027,548 B1
(45) Date of Patent: Apr. 11, 2006

(54) DELAY SETTINGS FOR A WIDE-RANGE, HIGH-PRECISION DELAY-LOCKED LOOP AND A DELAY LOCKED LOOP IMPLEMENTATION USING THESE SETTINGS

(75) Inventors: Chaitanya Palusa, Santa Clara, CA (US); Abhijit Ray, Santa Clara, CA (US)

(73) Assignee: Alliance Semiconductor Corporation, Santa Clara, CA (US)

( * ) Notice: Subject to any disclaimer, the term of this patent is extended or adjusted under 35 U.S.C. 154(b) by 682 days.

(21) Appl. No.: 09/873,016

(22) Filed: May 30, 2001

(51) Int. Cl.
*H03D 3/24* (2006.01)

(52) U.S. Cl. ....................................... 375/375; 327/158

(58) Field of Classification Search ................ 375/371, 375/373, 374–376; 327/142, 147, 148–150, 327/153, 157, 158, 159, 161; 331/57
See application file for complete search history.

(56) References Cited

U.S. PATENT DOCUMENTS

| | | | | |
|---|---|---|---|---|
| 5,559,476 | A * | 9/1996 | Zhang et al. | 331/57 |
| 5,910,741 | A * | 6/1999 | Watanabe | 327/150 |
| 5,994,934 | A * | 11/1999 | Yoshimura et al. | 327/158 |
| 6,166,572 | A * | 12/2000 | Yamaoka | 327/149 |
| 6,208,183 | B1 * | 3/2001 | Li et al. | 327/161 |
| 6,239,634 | B1 * | 5/2001 | McDonagh | 327/158 |
| 6,346,839 | B1 * | 2/2002 | Mnich | 327/158 |

* cited by examiner

*Primary Examiner*—Khanh Tran
(74) *Attorney, Agent, or Firm*—Stallman & Pollock LLP

(57) ABSTRACT

A delay-locked-loop (DLL) that has increased precision and a wide range of operation is formed by utilizing a chain of delay blocks to add or subtract a discreet amount of delay, and a voltage-controlled delay line (VCDL) to add or subtract a smaller amount of delay. The delay blocks allow the delayed clock signal to get close to the reference clock signal, while the VCDL allows the delayed clock signal to lock onto the reference clock signal.

15 Claims, 5 Drawing Sheets

DELAY SETTINGS FOR A WIDE-RANGE, HIGH-PRECISION DELAY-LOCKED LOOP AND A DELAY LOCKED LOOP IMPLEMENTATION USING THESE SETTINGS

BACKGROUND OF THE INVENTION

1. Field of the Invention

The present invention relates to a delay-locked loop and, more particularly, to the delay settings for a delay-locked loop implementation that has increased precision and a wide range of operation.

2. Description of the Related Art

A delay-locked loop (DLL) is a circuit that outputs a delayed clock signal that is delayed from and in phase with a reference clock signal. FIG. 1 shows a schematic diagram that illustrates a conventional DLL 100. As shown in FIG. 1, DLL 100 includes a voltage-controlled delay line (VCDL) 110 that receives a reference clock signal VCLK and a control voltage VCNTL, and outputs a delayed clock signal VDCK that is a delayed version of the reference clock signal VCLK. The amount of delay, in turn, is defined by the magnitude of the control voltage VCNTL.

As further shown in FIG. 1, DLL 100 also includes a phase detector 112 that detects the difference in phase between the reference clock signal VCLK and the delayed clock signal VDCK. When the reference clock signal VCLK leads the delayed clock signal VDCK, phase detector 112 asserts an up signal VUP.

On the other hand, when the reference clock signal VCLK lags the delayed clock signal VDCK, phase detector 112 asserts a down signal VDN. When the reference clock signal VCLK and the delayed clock signal VDCK are in phase, phase detector 112 asserts neither the up signal VUP nor the down signal VDN.

In addition, DLL 100 also includes a charge pump 114 that outputs a pump voltage VPM. Pump 114 increases the pump voltage VPM when the up signal VUP is asserted, and decreases the pump voltage VPM when the down signal VDN is asserted. The pump voltage VPM is unchanged when both the up signal VUP and the down signal VDN are de-asserted. Further, DLL 100 includes a filter 116 that filters the voltage output from pump 114 to provide the control voltage VCNTL.

In operation, phase detector 112 continues to adjust the pump voltage VPM via the up and down signals VUP and VDN, and thereby the control voltage VCNTL, until VCDL 110 adjusts the timing of the delayed clock signal VDCK to be in phase with the reference clock signal VCLK. When the delayed clock signal VDCK is in phase with the reference clock signal VCLK, DLL is locked and phase detector 112 inhibits the up and down signals VUP and VDN until the clock signals VDCK and VCLK fall out of lock.

DLLs are typically formed to accommodate a range of signal periods. One problem with DLLs, however, is that it is difficult to form a DLL that can accommodate a wide range of signal periods. For example, it is difficult to track clocks with periods varying from in 1 nS to 20 nS as the DLL should be able to delay the reference clock signal VCLK by a minimum of 1 nS and a maximum of 20 nS.

Another problem with DLLs is that it is difficult to obtain high precision (granularity) such that the delay varies evenly with the control voltage VCNTL. Ideally, the minimum delay provided by the DLL corresponds with a control voltage VCNTL equal to the lower supply voltage VSS, and the maximum delay provided by the DLL corresponds with a control voltage VCNTL equal to the upper supply voltage VCC. In addition, intermediate delays ideally vary proportionally as the control voltage VCNTL varies between the lower and upper supply voltages VSS and VCC.

In addition, DLLs are typically sensitive to temperature and process variations which, in turn, can prevent a DLL from locking on all frequencies. Thus, there is a need for a delay locked loop with increased precision and range of operation that is ideally insensitive to temperature and process variations.

SUMMARY OF THE INVENTION

The present invention provides a delay-locked-loop (DLL) that has increased precision and a wide range of operation by utilizing a chain of delay blocks to add or subtract a discreet amount of delay, and a delay line to add or subtract a smaller amount of delay. The delay blocks bring the difference between the delayed clock signal and the reference clock signal to within the locking range of the delay line, while the delay line locks the delayed clock signal to the reference clock signal.

The DLL of the present invention includes a voltage-controlled delay line (VCDL) that varies a timing of the delayed clock signal with respect to an intermediate clock signal in response to the magnitude of a control voltage. The DLL also includes a phase detector connected to the VCDL that detects a difference in phase between a reference clock signal and the delayed clock signal. The phase detector asserts an up signal when the reference clock signal leads the delayed clock signal, a down signal when the reference clock signal lags the delayed clock signal, and a synch signal when the reference clock signal and the delayed clock signal are in phase.

Further, the DLL includes a charge pump connected to the phase detector that outputs a pump voltage. The charge pump increases the pump voltage when the up signal is asserted, decreases the pump voltage when the down signal is asserted, and leaves the pump voltage unchanged when the synch signal is asserted. In addition, the DLL includes a filter connected to the charge pump and the VCDL that filters the pump voltage to output the control voltage.

In accordance with the present invention, the DLL includes a delay circuit that varies a timing of the intermediate clock signal with respect to the reference clock signal by adding or subtracting incremental units of delay in response to the control voltage and the logic states of the up signal, the down signal, and the synch signal. This is a preliminary process of coarse delay adjustments, which can be implemented using digital delay blocks.

The present invention also includes a method for locking a delayed clock signal to a reference clock signal such that the delayed clock signal has a delay with respect to the reference clock signal. The method of the present invention includes the step of varying a timing of the delayed clock signal with respect to an intermediate clock signal with a voltage-controlled delay line (VCDL) in response to a magnitude of a control voltage. This process involves fine delay adjustments and is implemented using analog blocks for greater precision.

The method also includes the step of detecting with a phase detector a difference in phase between a reference clock signal and the delayed clock signal. The method further includes the step of asserting with the phase detector an up signal when the reference clock signal leads the delayed clock signal, a down signal when the reference clock signal lags the delayed clock signal, and a synch signal when the reference clock signal and the delayed clock signal are in phase.

In addition, the method includes the step of outputting with a charge pump a pump voltage. The pump voltage increases when the up signal is asserted, decreases when the down signal is asserted, and is unchanged when the synch signal is asserted. Further, the method includes the step of filtering with a filter the pump voltage to output the control voltage.

In accordance with the method of the present invention, the method includes the step of varying a timing of the intermediate clock signal with respect to the reference clock signal with a delay circuit by adding or subtracting incremental units of delay in response to the control voltage and the logic states of the up signal, the down signal, and the synch signal.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
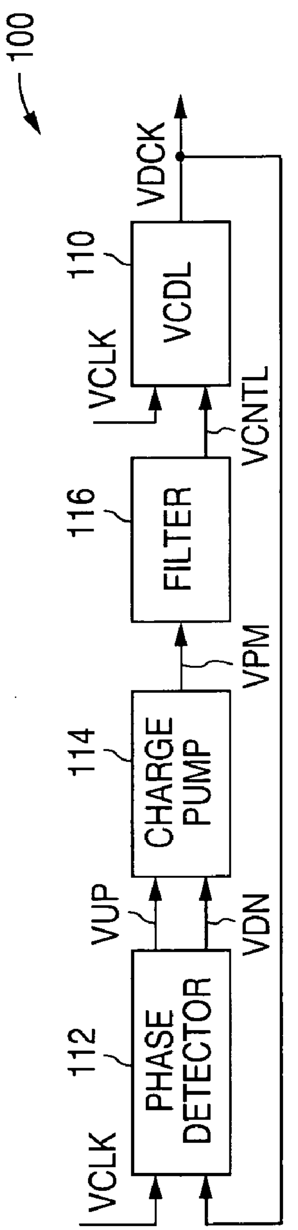
FIG. 1 is a schematic diagram illustrating a conventional delay-locked-loop (DLL) 100.
Figure 2:
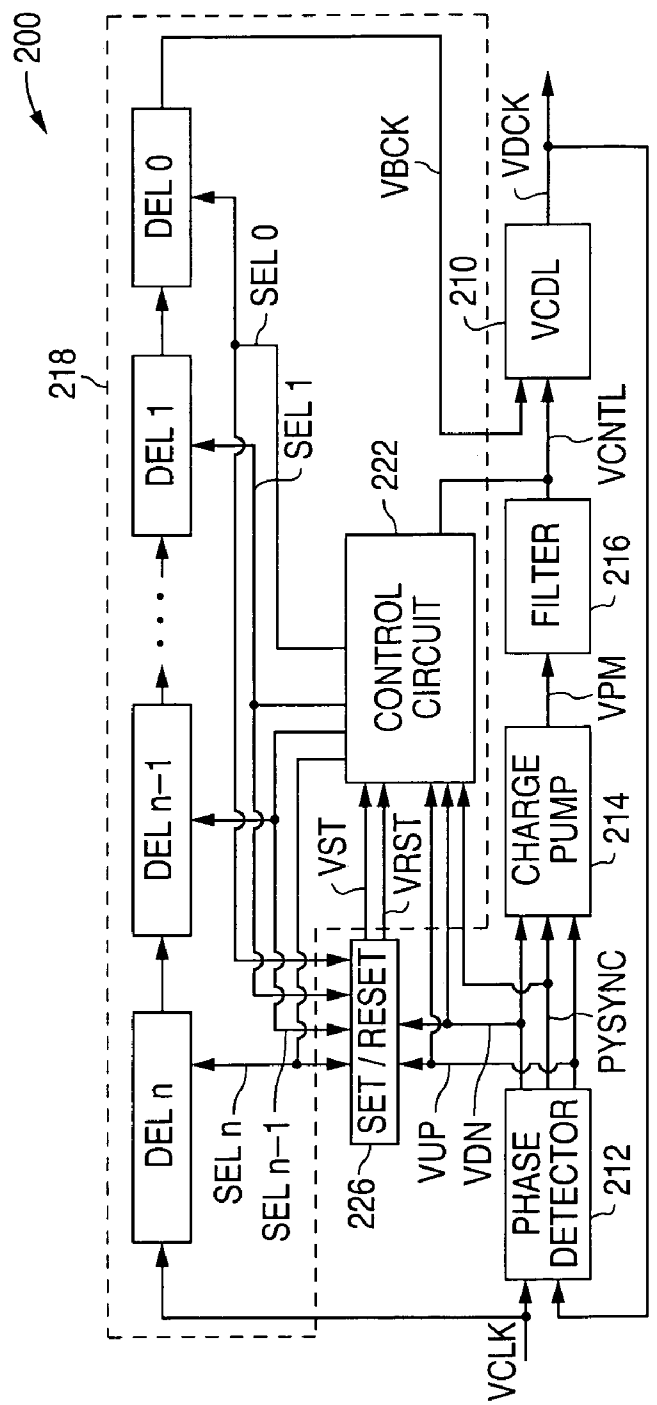
FIG. 2 is a schematic diagram illustrating a DLL 200 in accordance with the present invention.
Figure 3:
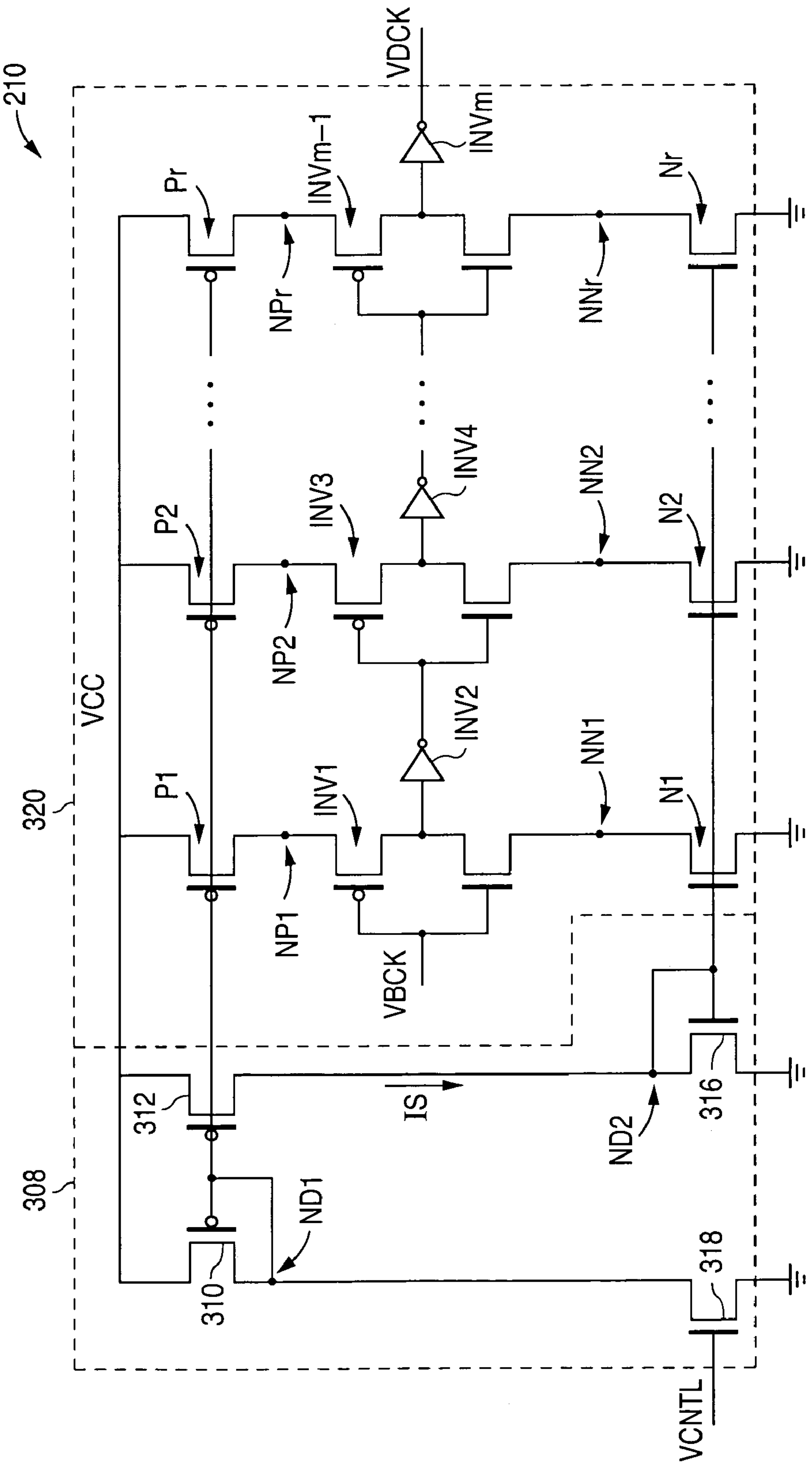
FIG. 3 is a schematic diagram illustrating an example of VCDL 210 in accordance with the present invention.

FIG. 2 shows a schematic diagram that illustrates a delay-locked-loop (DLL) 200 in accordance with the present invention. As shown in FIG. 2, DLL 200 includes a voltage-controlled delay line (VCDL) 210 that varies a timing of a delayed clock signal VDCK with respect to an intermediate clock signal VBCK in response to the magnitude of a control voltage VCNTL. FIG. 3 shows a schematic diagram that illustrates an example of VCDL 210 in accordance with the present invention.

As shown in FIG. 3, VCDL 210 includes a voltage-controlled current stage 308 that generates a switching current IS that has a magnitude that is defined by the magnitude of the control voltage VCNTL. Stage 308 includes a p-channel diode-connected transistor 310 that has a source connected to a power supply node VCC, and a gate and drain connected to a first diode node ND1. VCDL 210 also includes a p-channel transistor 312 that has a source connected to the power supply node VCC, a gate connected to the gate of transistor 310, and drain connected to a second diode node ND2.

Stage 308 further includes an n-channel transistor 314 and a n-channel diode-connected transistor 316. Transistor 314 has a drain connected to the first diode node ND1, a gate connected to receive the control voltage VCNTL, and a source connected to ground. Transistor 316 has a drain and a gate connected to the second diode node ND2, and a source connected to ground.

In operation, the control voltage VCNTL on the gate of transistor 314 sets the drain current of transistor 314 which, in turn, sets the drain current of transistor 310. The drain current of transistor 312 mirrors (is proportional to) the drain current of transistor 310 which, in turn, sets the drain current of transistor 316. The drain currents of transistors 312 and 316 are equal, and define the switching current IS.

As further shown in FIG. 3, VCDL 210 also includes a fine-delay stage 320 that delays the intermediate clock signal VBCK to output the delayed clock signal VDCK. Stage 320 has a propagation delay which is defined by the magnitude of the switching current IS. The delayed clock signal VDCK, in turn, is delayed in time from the intermediate clock signal VBCK by the propagation delay.

Stage 320 includes a number of p-channel mirror transistors P1–Pr. Each transistor P1–Pr has a source connected to the power supply node VCC, a gate connected to the gate of diode-connected transistor 310, and a drain connected to a corresponding one of a number of nodes NP1–NPr.

Stage 320 further includes a number of n-channel mirror transistors N1–Nr. Each transistor N1–Nr has a source connected to ground, a gate connected to the gate of diode-connected transistor 316, and a drain connected to a corresponding one of a number of nodes NN1–NNr.

Stage 320 additionally includes a number of inverters INV1–INVm (where m equals 2r) which are connected to nodes NP1–NPr and NN1–NNr so that each odd numbered inverter is connected to a node NP1–NPr and a node NN1–NNr. In addition, the first inverter INV1 is connected to receive the intermediate clock signal VBCK, and the last inverter INVm is connected to output the delayed clock signal VDCK.

In operation, the drain currents of transistors P1–Pr mirror (are proportional to) the drain current of transistor 310, while the drain currents of transistors N1–Nr mirror (are proportional to) the drain current of transistor 316. Thus, the magnitude of the current flowing through each odd-numbered inverter is proportional to the switching current IS which, in turn, is defined by the magnitude of the control voltage VCNTL.

The magnitude of the current flowing through an inverter determines how quickly the inverter can change logic states. Thus, by varying the control voltage VCNTL, which varies the switching current IS, the time required for a change in logic state on the input of the first inverter INV1 to appear on the output of the last inverter INVm can be varied. The delay provided by the VCDL can be seen to decrease with increase in VCNTL and vice-versa. For dual edge tracking, the duty cycle should not be degraded. The transistors have to be appropriately sized to get equal rise and fall delays.

Returning again to FIG. 2, DLL 200 also includes a phase detector 212 that detects the difference in phase between the reference clock signal VCLK and the delayed clock signal VDCK. When the reference clock signal VCLK leads the delayed clock signal VDCK, phase detector 212 asserts an up signal VUP.

On the other hand, when the reference clock signal VCLK lags the delayed clock signal VDCK, phase detector 212 asserts a down signal VDN. When the reference clock signal VCLK and the delayed clock signal VDCK are in phase (have rising edges at the same time or within a predefined error tolerance), phase detector 212 asserts a phase synchronization signal PYSYNC.

Figure 4:
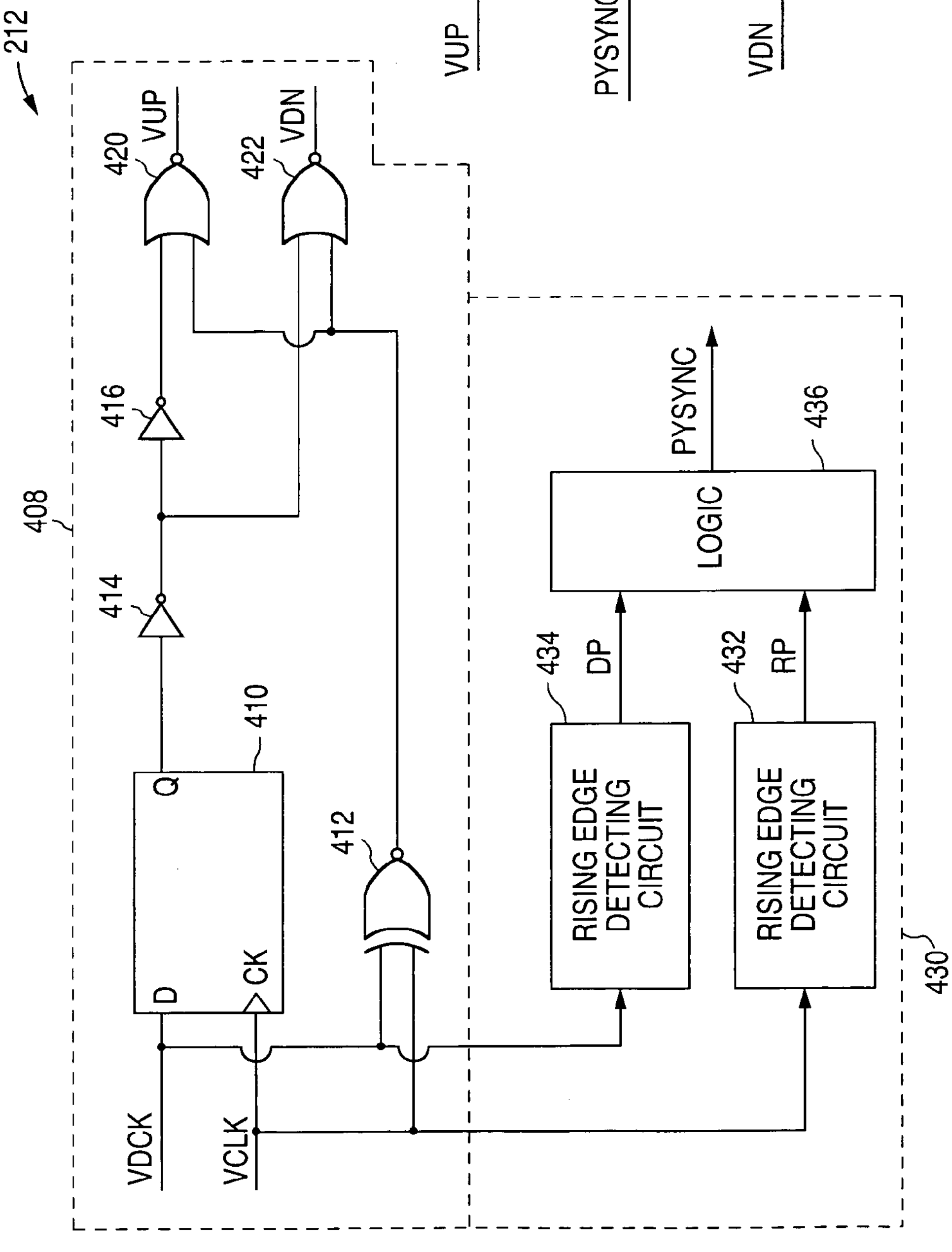
FIG. 4 is a schematic diagram illustrating an example of phase detector 212 in accordance with the present invention.

FIG. 4 shows a schematic diagram that illustrates an example of phase detector 212 in accordance with the present invention. As shown in FIG. 4, phase detector 212 includes an up/down circuit 408 that asserts the up and down signals VUP and VDN in response to the relative timing of the rising edges of the reference clock signal VCLK and the delayed clock signal VDCK.

Circuit 408 includes a D-Q flip-flop 410 and an XNOR gate 412. Flip-flop 410 has a D input connected to receive the delayed clock signal VDCK, and a clock input connected to receive the reference clock signal VCLK. XNOR gate 412 has the delayed clock signal VDCK and the reference clock signal VCLK as its inputs.

Circuit 408 further includes a first inverter 414 which has an input connected to the Q output of flip-flop 410, and a second inverter 416 which has an input connected to the output of first inverter 414. In addition, circuit 408 includes a first NOR gate 420 and a second NOR gate 422.

NOR gate 420 has a first input connected to the output of gate 412 and a second input connected to the output of the second inverter 416. NOR gate 420 also has an output that outputs the up signal VUP. NOR gate 422 has a first input connected to the output of gate 412 and a second input connected to the output of the first inverter 414. NOR gate 422 also has an output that outputs the down signal VDN.

In operation, the outputs of NOR gates 420 and 422 (the up and down signals VUP and VDN) are asserted only when both inputs are low. Since the second input of NOR gate 420 is connected to the output of second inverter 416 and the second input of NOR gate 422 is connected to the output of first inverter 414, which is the input of the second inverter 416, only one of these second inputs can be low at any one time. Thus, the up and down signals VUP and VDN can not be asserted at the same time.

In addition, the first inputs of NOR gates 420 and 422 are connected to the output of XNOR gate 412 which is low only when the logic states of the clock signals VCLK and VDCK are different. Thus, the up and down signals VUP and VDN can not be asserted when the clock signals VCLK and VDCK have the same logic state.

Figure 5A:
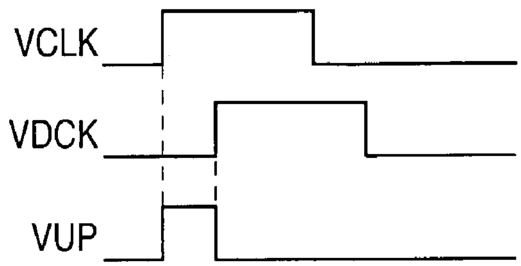
FIGS. 5A–5B are timing diagrams illustrating the operation of circuit 408 in accordance with the present invention.
Figure 5B:
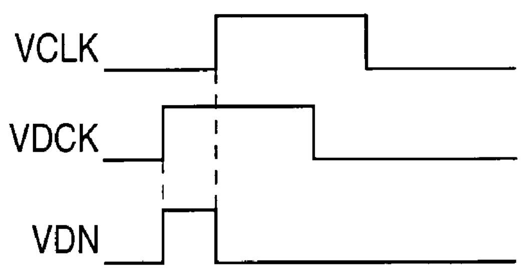

FIGS. 5A–5B show timing diagrams that illustrate the operation of circuit 408 in accordance with the present invention. As shown in FIG. 5A, when the logic states of both the reference and delayed clock signals VCLK and VDCK are low, the output of XNOR gate 412 is high. This, in turn, causes the outputs of both NOR gates 420 and 422 (the up and down signals VUP and VDN) to be low. When the logic state of the reference clock signal VCLK goes high, flip-flop 410 latches a logic low on the Q output. In addition, the output of XNOR gate 412 goes low. As a result, NOR gate 420 asserts the up signal VUP by outputting a logic high.

When the delayed clock signal VDCK goes high, the output of XNOR gate 412 goes high which, in turn, causes the output of NOR gate 420 to go low. This process of latching a logic low and asserting the up signal VUP continues until the delayed clock signal VDCK, which is lagging the reference clock signal VCLK, begins to lead the reference clocks signal VCLK.

As shown in FIG. 5B, when the logic states of both the reference and delayed clock signals VCLK and VDCK are low, the output of XNOR gate 412 is high. This, in turn, causes the outputs of both NOR gates 420 and 422 (the up and down signals VUP and VDN) to be low. When the logic state of the delayed clock signal VDCK goes high, the output of XNOR gate 412 goes low. Assuming that a logic high is on the Q output, NOR gate 422 asserts the down signal VDN by outputting a logic high.

When the reference clock signal VCLK strobes the clock input, flip-flop 410 latches a logic high. In addition, the output of XNOR gate 412 goes high which, in turn, causes the output of NOR gate 422 to go low. This process of latching a logic high and asserting the down signal VDN continues until the delayed clock signal VDCK, which is leading the reference clock signal VCLK, begins to lag the reference clocks signal VCLK.

As further shown in FIG. 4, phase detector 212 includes a synch detecting circuit 430 that asserts a phase synchronization signal PYSYNC when the reference clock signal VCLK and the delayed clock signal VDCK are in phase (have rising edges at the same time or within a predefined error tolerance).

Circuit 430 includes a first rising edge detecting circuit 432 that receives the reference clock signal VCLK, and outputs a reference pulse RP having a predefined width in response to the rising edge of the reference clock signal VCLK. Similarly, circuit 430 includes a second rising edge detecting circuit 434 that receives the delayed clock signal VDCK, and outputs a pulse DP having a predefined width in response to the rising edge of the delayed clock signal VDCK. Circuit 430 further includes a logic circuit 436 that asserts the phase synchronization signal PYSYNC when the reference and delayed pulses RP and DP overlap.

Figure 5C:
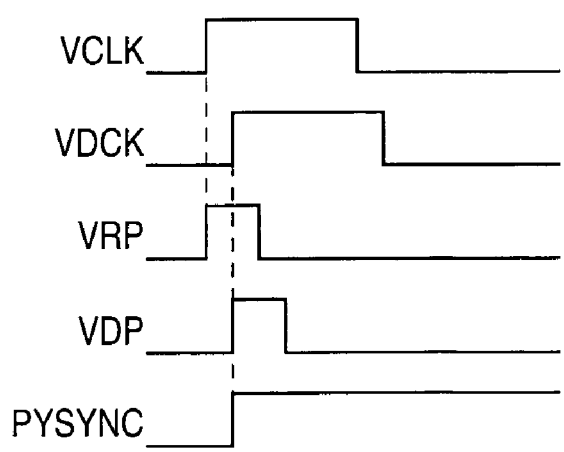
FIG. 5C is a timing diagram illustrating the operation of circuit 430 in accordance with the present invention.

FIG. 5C shows a timing diagram that illustrates the operation of circuit 430 in accordance with the present invention. As shown in FIG. 5C, if there is any overlap between the reference and delayed pulses RP and DP, the synchronization signal PYSYNC, which is otherwise low, is asserted. Further, by varying the width of the reference and delayed pulses RP and DP, the precision to which the reference and delayed clock signals VCLK and VDCK are considered in phase can be set.

Returning again to FIG. 2, DLL 200 also includes a charge pump 214 that outputs a pump voltage VPM. Pump 214 increases the pump voltage VPM when the up signal VUP is asserted, and decreases the pump voltage VPM when the down signal VDN is asserted. The pump voltage VPM is unchanged when the synchronization signal PYSYNC is asserted.

Figure 6:
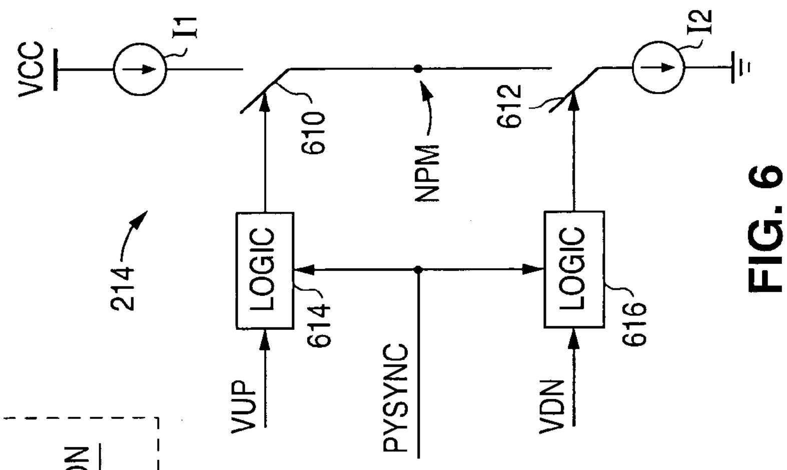
FIG. 6 is a schematic diagram illustrating a conventional implementation of charge pump 214.

FIG. 6 shows a schematic diagram that illustrates an example of charge pump 214. As shown in FIG. 6, charge pump 214 includes a first current source I1, and an up switch 610 (such as a MOS transistor) that is connected to the first current source I1 and a pump node NPM. In addition, charge pump 214 includes a down switch 612 (such as a MOS transistor) that is connected to the pump node NP, and a second current source I2 that is connected to down switch 612.

Further, charge pump 214 includes a logic block 614 that passes the logic state of the up signal VUP when the synchronization signal PYSYNC is de-asserted, and outputs a logic low when the synchronization signal PYSYNC is asserted. Charge pump 214 also includes a logic block 616 that passes the logic state of the down signal VDN when the synchronization signal PYSYNC is de-asserted, and outputs a logic low when the synchronization signal PYSYNC is asserted.

In operation, when the up signal VUP is asserted and the synchronization signal PYSYNC is de-asserted, up switch 610 is closed and the first current source I1 sources current into the pump node NP, thereby increasing the voltage on the pump node NP. Similarly, when the down signal VDN is asserted and the synchronization signal PYSYNC is de-asserted, down switch 612 is closed and the second current source I2 sinks current from the pump node, thereby decreasing the voltage on the pump node NP.

Returning to FIG. 2, DLL 200 includes a filter 216 that filters the pump voltage VPM output from pump 214 to provide the control voltage VCNTL. Filter 216 can be implemented as a monolithic RC filter by using polysilicon resistors and MOS transistors.

In accordance with the present invention, DLL 200 also includes a delay circuit 218 that varies the timing of the intermediate clock signal VBCK with respect to the reference clock signal VCLK by adding or subtracting incremental units of delay. Delay circuit 218 includes a number of delay blocks DEL0–DELn which each provide a predetermined delay when turned on or inserted into the signal path, and essentially no delay when turned off or removed from the signal path.

Delay circuit 218 further includes a control circuit 222 that defines the amount of delay provided by delay blocks DEL0–DELn by controlling the on-off state of the delay blocks DEL0–DELn. Delay circuit 218 responds to the control voltage VCNTL and the logic states of the up signal VUP, the down signal VDN, and the phase synchronized signal PYSYNC.

In operation, the control voltage VCNTL is divided into three regions; a lower region such as 0 to Vtn where Vtn is the threshold voltage of an n-channel transistor, a middle region such as Vtn to (VCC-|Vtp|) where |Vtp| is the absolute value of the threshold voltage of a p-channel transistor, and an upper region such as (VCC-|Vtp|) to VCC.

When the reference clock signal VCLK lags the delayed clock signal VDCK, the down signal VDN is asserted. The assertion of the down signal VDN when the control voltage VCNTL is in the lower region turns on a delay block DEL, which increases the delay added to the delayed clock signal VDCK. This process continues with each cycle of the reference clock signal VCLK until the delay provided by delay blocks DEL0–DELn is sufficient to allow VCDL 210 to lock or synchronize the clock signals VCLK and VDCK.

When the control voltage VCNTL is in the middle region, the reference clock signal VCLK and the delayed clock signal VDCK are within a range which allows VCDL to lock or synchronize the clock signals VCLK and VDCK.

When the reference clock signal VCLK leads the delayed clock signal VDCK, the up signal VUP is asserted. The assertion of the up signal VUP when the control voltage VCNTL is in the upper region turns off a delay block DEL, which decreases the delay added to the delayed clock signal. This process continues with each cycle of the reference clock signal VCLK until the delay provided by delay blocks DEL0–DELn is sufficient to allow VCDL 210 to lock or synchronize the clock signals VCLK and VDCK.

Figure 7:
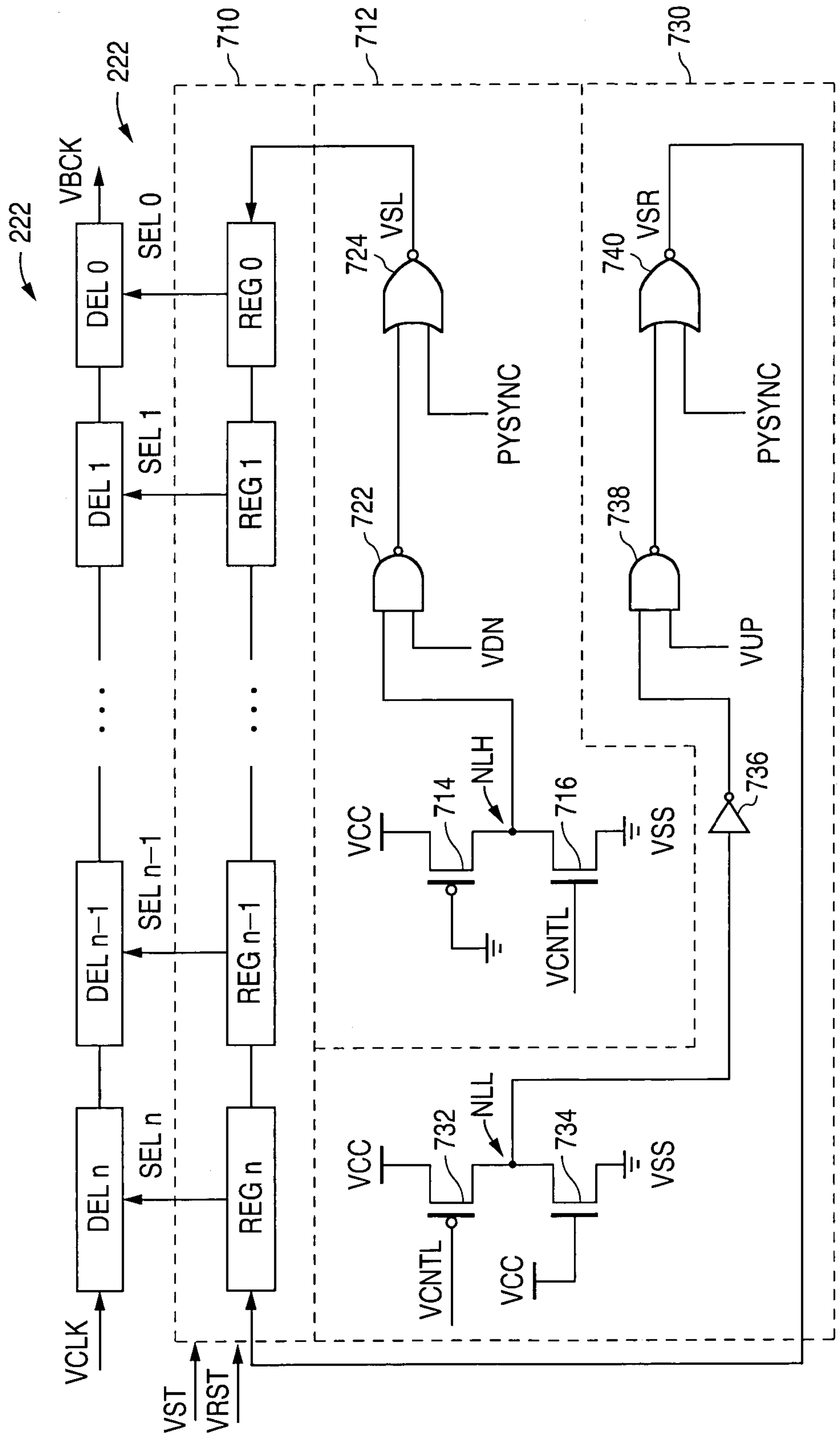
FIG. 7 is a schematic diagram illustrating control circuit 222 in accordance with the present invention.

FIG. 7 shows a schematic diagram that illustrates control circuit 222 in accordance with the present invention. As shown in FIG. 7, control circuit 222 includes a shift register 710 that includes a number of registers REG0–REGn that output a corresponding number of select signals SEL0–SELn. The output of each register REG, in turn, is connected to a corresponding delay block DEL.

As further shown in FIG. 7, control circuit 222 includes a down stage 712 that asserts a shift left signal VSL in response to the control voltage VCNTL, the down signal VDN, and the phase synchronized signal PYSYNC. Down stage 712 includes a weakly biased p-channel transistor 714 and an n-channel transistor 716. Transistor 714 has a source connected to the power supply voltage VCC, a gate connected to ground, and a drain connected to a node NLH. Transistor 716 has a source connected to ground, a gate connected to receive the control voltage VCNTL, and a drain connected to the node NLH.

Down stage 712 also includes a NAND gate 722 and a NOR gate 724. NAND gate 722 has a first input connected to the node NLH, a second input connected to receive the down signal VDN, and an output. NOR gate 724 includes a first input connected to receive the output of NAND gate 722, a second input connected to receive the synchronized signal PYSYNC, and an output that outputs the shift left signal VSL.

Control circuit 222 further includes an up stage 730 that asserts a shift right signal VSR in response to the control voltage VCNTL, the up signal VUP, and the phase synchronized signal PYSYNC. Up stage 730 includes a p-channel transistor 732 and a weakly biased n-channel transistor 734. Transistor 732 has a source connected to the power supply voltage VCC, a gate connected to the control voltage VCNTL, and a drain connected to a node NLL. Transistor 734 has a source connected to ground, a gate connected to the power supply voltage VCC, and a drain connected to the node NLL.

Up stage 730 also includes an inverter 736, a NAND gate 738 and a NOR gate 740. Inverter 736 has an input connected to the node NLL and an output. NAND gate 738 has a first input connected to the output of inverter 736, a second input connected to receive the up signal VUP, and an output. NOR gate 740 includes a first input connected to receive the output of NAND gate 738, a second input connected to receive the synchronized signal PYSYNC, and an output that outputs the shift right signal VSR.

In operation, the first input of NAND gate 722 is a logic high only when the control voltage VCNTL is in the lower region (is less than the threshold voltage Vtn of transistor 716). Thus, NAND gate 722 outputs a logic low each time the down signal VDN is asserted and the control voltage VCNTL is in the lower region.

Further, as long as the synchronized signal PYSYNC is low (clock signal VCLK and VDCK not in synch), NOR gate 724 outputs a logic high each time the output from NAND gate 722 is low, thereby causing the shift left signal VSL to be asserted. When the synchronized signal PYSYNC is high (clock signal VCLK and VDCK in synch), NOR gate 724 outputs a logic low.

Similarly, the input of inverter 736 is a logic low only when the control voltage VCNTL is in the upper region (within the range of the threshold voltage Vtp of transistor 732 from the upper supply rail VCC). Thus, the first input of NAND gate 738 is a logic high only when the control voltage VCNTL is in the upper region.

NAND gate 738 outputs a logic low each time the up signal VUP is asserted and the control voltage VCNTL is in the upper region. Further, as long as the synchronized signal PYSYNC is low (clock signal VCLK and VDCK not in synch), NOR gate 740 outputs a logic high each time the output from NAND gate 738 is low, thereby causing the shift right signal VSR to be asserted. When the synchronized signal PYSYNC is high (clock signal VCLK and VDCK in synch), NOR gate 740 outputs a logic low.

Each time the shift right signal VSR is asserted, a logic zero is shifted right in shift register 710. For example, assuming a logic one is output by registers REG0 and REG1, and a logic zero is output by the remaining registers. If the shift right signal VSR is asserted once, register REG1 changes to output a logic zero, while register REG0 remains the same and other registers still output a logic zero.

In addition, each time the shift left signal VSL is asserted, a logic one is shifted left in shift register 710. For example, assuming a logic one is output by only register REG0, and a logic zero is output by the remaining registers. If the shift left signal VSL is asserted once, register REG1 changes to output a logic one, while register REG0 remains the same and other registers still output a logic zero.

Further, as registers REG0–REGn turn off and on (logic zero or logic one respectively), the corresponding delay block DEL is turned off and on. For example, if the delayed clock signal VDCK leads the reference clock signal VCLK, additional delay needs to be added to the delayed clock signal VDCK. As noted above, each time the delayed clock signal VDCK leads the reference clock signal VCLK when the rising edge of the reference clock signal VCLK is detected, phase detector 212 asserts the down signal VDN. The down signal VDN, in turn, causes the shift left signal VSL to be asserted which, in turn, causes an additional delay block DEL to be turned on. This adds delay to the intermediate clock signal VBCK and thus, adds delay to the delayed clock signal VDCK.

On the other hand, if the delayed clock signal VDCK lags the reference clock signal VCLK, delay needs to be removed from the delayed clock signal VDCK. As noted above, each time the delayed clock signal VDCK lags the reference clock signal VCLK when the rising edge of the reference clock signal VCLK is detected, phase detector 212 asserts the up signal VUP. The up signal VUP, in turn, causes the shift right signal VSR to be asserted which, in turn, causes a delay block DEL to be turned off. This removes delay from the intermediate clock signal VBCK and thus, removes delay from the delayed clock signal VDCK.

Returning again to FIG. 2, DLL 200 of the present invention also includes a set/reset circuit 226. Circuit 226 asserts a reset signal VRST that resets each register REG to a logic low when the output of each register REG is a logic high and the shift left signal VSL is asserted. In addition, circuit 226 also asserts a set signal VST that sets each register REG to a logic high when the output of each register REG is a logic low and the shift right signal VSR is asserted. (When DLL 200 is initially powered on, the registers REG0–REGn are set to a logic low to turn off all of the delay blocks DEL0–DELn.)

DLL 200 may get stuck in a state without locking. In this case, circuit 226 sets/resets the logic state of each register REG to start the feedback process all over again. DLL 200 can get stuck because of improper initial conditions, a random glitch, or any other unexpected condition.

Thus, a DLL has been described that has a wide range of operation with a high precision dual-edge synchronization. Since the DLL of the present invention utilizes a feedback mechanism, the DLL is largely insensitive to process and temperature variations, provided that it is within the range of the DLL.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A delay-locked-line (DLL) comprising:

a voltage-controlled delay line (VCDL) that varies a timing of a delayed clock signal with respect to an intermediate clock signal in response to a magnitude of a control voltage;

a phase detector connected to the VCDL that detects a difference in phase between a reference clock signal and the delayed clock signal, the phase detector asserting an up signal when the reference clock signal leads the delayed clock signal, a down signal when the reference clock signal lags the delayed clock signal, and a synch signal when the reference clock signal and the delayed clock signal are in phase;

a charge pump connected to the phase detector that outputs a pump voltage, the charge pump increasing the pump voltage when the up signal is asserted, decreasing the pump voltage when the down signal is asserted, and leaving the pump voltage unchanged when the synch signal is asserted;

a filter connected to the charge pump and the VCDL that filters the pump voltage to output the control voltage; and a delay circuit that varies a timing of the intermediate clock signal with respect to the reference clock signal by adding or subtracting incremental units of delay in response to the control voltage and the logic states of the up signal, the down signal, and the synch signal; and wherein the VCDL includes:

a voltage-controlled current stage that outputs a switching current having a magnitude defined by the magnitude of the control voltage; and a fine-delay stage having a number of devices, the devices having a propagation delay, a magnitude of the propagation delay being defined by the magnitude of the switching current, the delayed clock signal being delayed in time from the intermediate clock signal by the propagation delay, and wherein the phase detector includes:

a D-Q flip-flop having a D input connected to receive the delayed clock signal, a clock input connected to receive the reference clock signal, and a Q output;

an XNOR gate having a first input connected to receive the delayed clock signal, a second input connected to receive the reference clock signal, and an output;

a first inverter having an input connected to the Q output, and an output;

a second inverter having an input connected to the output of the first inverter, and an output;

a first NOR gate having a first input connected to the output of the XNOR gate, a second input connected to the output of the second inverter, and an output that outputs the up signal; and a second NOR gate having a first input connected to the output of the XNOR gate, a second input connected to the output of the first inverter, and an output that outputs the down signal.

2. The DLL of claim 1 wherein the phase detector includes:

a first rising edge detecting circuit that receives the reference clock signal, and asserts a reference pulse having a predefined width in response to the rising edge of the reference clock signal;

a second rising edge detecting circuit that receives the delayed clock signal, and asserts a delayed pulse having a predefined width in response to the rising edge of the reference clock signal; and a logic circuit that outputs the synch signal when the reference pulse and delayed pulse are asserted and overlap.

3. The DLL of claim 1 wherein the delay circuit includes a number of delay blocks, each delay block having a first predetermined delay when turned on, and a second predetermined delay when turned off, the second predetermined delay being less than the first predetermined delay.

4. The DLL of claim 3 wherein the delay circuit further includes a control circuit that defines the amount of delay provided by the delay circuit by controlling the on-off state of the delay blocks in response to the logic states of the up signal, the down signal, and the synch signal.

5. The DLL of claim 4 wherein the control circuit includes:

a shift register having a chain of registers, the shift register shifting a logic high in a first direction of the chain each time a shift left signal is asserted, and shifting a logic low in a second direction of the chain each time a shift right signal is asserted, each register having an output connected to a corresponding delay block;

an up stage that asserts the shift right signal each time the up signal is asserted when the control voltage is in an upper range; and a down stage that asserts the shift left signal each time the down signal is asserted when the control voltage is in a lower range.

6. The DLL of claim 5 wherein neither the shift right signal nor the shift left signal is asserted when the synch signal is asserted.

7. The DLL of claim 1 wherein the delay circuit includes a number of delay blocks, each delay block having a first predetermined delay when inserted into a reference clock signal path, and a second predetermined delay when removed from the reference clock signal path, the second predetermined delay being less than the first predetermined delay.

8. The DLL of claim 7 wherein the delay circuit further includes a control circuit that defines the amount of delay provided by the delay circuit by controlling the on-off state of the delay blocks in response to the logic states of the up signal, the down signal, and the synch signal.

9. The DLL of claim 8 wherein the control circuit includes:

a shift register having a chain of registers, the shift register shifting a logic high in a first direction of the chain each time a shift left signal is asserted, and shifting a logic low in a second direction of the chain each time a shift right signal is asserted, each register having an output connected to a corresponding delay block;

an up stage that asserts the shift right signal each time the up signal is asserted when the control voltage is in an upper range; and a down stage that asserts the shift left signal each time the down signal is asserted when the control voltage is in a lower range.

10. The DLL of claim 9 wherein neither the shift right signal nor the shift left signal is asserted when the synch signal is asserted.

11. The DLL of claim 1 and further comprising a reset circuit that resets each register to a logic low when the output of each register is a logic high and the shift left signal is asserted, and sets each register to a logic high when the output of each register is a logic low and the shift right signal is asserted.

12. A method of locking a delayed clock signal to a reference clock signal, the delayed clock signal having a delay with respect to the reference clock signal, the method comprising the steps of:

varying a timing of the delayed clock signal with respect to an intermediate clock signal with a voltage-controlled delay line (VCDL) in response to a magnitude of a control voltage;

detecting with a phase detector a difference in phase between a reference clock signal and the delayed clock signal;

asserting with the phase detector an up signal when the reference clock signal leads the delayed clock signal, a down signal when the reference clock signal lags the delayed clock signal, and a synch signal when the reference clock signal and the delayed clock signal are in phase;

outputting with a charge pump a pump voltage, the pump voltage increasing when the up signal is asserted, decreasing when the down signal is asserted, and being unchanged when the synch signal is asserted;

filtering with a filter the pump voltage to output the control voltage; and varying a timing of the intermediate clock signal with respect to the reference clock signal with a delay circuit by adding or subtracting incremental units of delay in response to the control voltage and the logic states of the up signal, the down signal, and the synch signal, and wherein the step of varying a timing of the delayed clock signal includes:

outputting a switching current having a magnitude defined by the magnitude of the control voltage; and delaying the delayed clock signal with respect to the intermediate clock signal an amount defined by the magnitude of the switching current, and wherein the delay circuit includes a number of delay blocks, each delay block having a first predetermined delay when turned on, and a second predetermined delay when turned off, the second predetermined delay being less than the first predetermined delay.

13. The method of claim 12 and further comprising the step of defining the amount of delay provided by the delay circuit by controlling the on-off state of the delay blocks with a shift register in response to the logic states of the up signal, the down signal, and the synch signal.

14. The method of claim 13 wherein the shift register has a chain of registers, and further including the steps of shifting a logic high in a first direction of the chain each time a shift left signal is asserted, and shifting a logic low in a second direction of the chain each time a shift right signal is asserted, each register having an output connected to a corresponding delay block;

asserting the shift right signal each time the up signal is asserted when the control voltage is in an upper range; and asserting the shift left signal each time the down signal is asserted when the control voltage is in a lower range.

15. The method of claim 14 wherein neither the shift right signal nor the shift left signal is asserted when the synch signal is asserted.

* * * * *